(12) United States Patent
Tsai et al.

(10) Patent No.: US 11,355,635 B2
(45) Date of Patent: Jun. 7, 2022

(54) SEMICONDUCTOR STRUCTURE AND METHODS OF FORMING SAME

(71) Applicant: Taiwan Semiconductor Manufacturing Company, Ltd., Hsinchu (TW)

(72) Inventors: Chun-Hsiung Tsai, Xinpu Township (TW); Kuo-Feng Yu, Zhudong Township (TW); Kei-Wei Chen, Tainan (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 111 days.

(21) Appl. No.: 16/741,364

(22) Filed: Jan. 13, 2020

(65) Prior Publication Data

US 2020/0152792 A1    May 14, 2020

Related U.S. Application Data

(60) Continuation of application No. 15/985,495, filed on May 21, 2018, now Pat. No. 10,535,768, which is a
(Continued)

(51) Int. Cl.
*H01L 27/088* (2006.01)
*H01L 29/78* (2006.01)
*H01L 29/66* (2006.01)
*H01L 21/223* (2006.01)
*H01L 21/324* (2006.01)
(Continued)

(52) U.S. Cl.
CPC ...... *H01L 29/7834* (2013.01); *H01L 21/2236* (2013.01); *H01L 21/2254* (2013.01); *H01L 21/31155* (2013.01); *H01L 21/324* (2013.01); *H01L 21/823814* (2013.01);
(Continued)

(58) Field of Classification Search
CPC ............ H01L 29/7834; H01L 21/2236; H01L 21/2254; H01L 21/31155; H01L 21/324; H01L 21/823814; H01L 21/823821; H01L 27/0924; H01L 29/66492; H01L 29/66803
See application file for complete search history.

(56) References Cited

U.S. PATENT DOCUMENTS 8,785,286 B2   7/2014  Tsai et al.
9,111,962 B1   8/2015  Alptekin et al.
(Continued)

FOREIGN PATENT DOCUMENTS

CN   102237278 A   11/2011
CN   105990239 A   10/2016
(Continued)

*Primary Examiner* — Victor A Mandala
*Assistant Examiner* — Colleen E Snow
(74) *Attorney, Agent, or Firm* — Slater Matsil, LLP

(57) ABSTRACT

A semiconductor structure includes a substrate, a first semiconductor fin, a second semiconductor fin, and a first lightly-doped drain (LDD) region. The first semiconductor fin is disposed on the substrate. The first semiconductor fin has a top surface and sidewalls. The second semiconductor fin is disposed on the substrate. The first semiconductor fin and the second semiconductor fin are separated from each other at a nanoscale distance. The first lightly-doped drain (LDD) region is disposed at least in the top surface and the sidewalls of the first semiconductor fin.

20 Claims, 12 Drawing Sheets

Related U.S. Application Data division of application No. 14/853,839, filed on Sep. 14, 2015, now Pat. No. 9,978,866.

(60) Provisional application No. 62/151,286, filed on Apr. 22, 2015.

(51) Int. Cl.
 *H01L 21/225* (2006.01)
 *H01L 21/8238* (2006.01)
 *H01L 27/092* (2006.01)
 *H01L 21/3115* (2006.01)

(52) U.S. Cl.
 CPC .. *H01L 21/823821* (2013.01); *H01L 27/0924* (2013.01); *H01L 29/66492* (2013.01); *H01L 29/66803* (2013.01)

(56) References Cited

U.S. PATENT DOCUMENTS

| | | |
|---|---|---|
| 2008/0050897 A1 | 2/2008 | Kottantharayil |
| 2011/0074498 A1 | 3/2011 | Thompson et al. |
| 2011/0195555 A1 | 8/2011 | Tsai et al. |
| 2011/0269287 A1 | 11/2011 | Tsai et al. |
| 2012/0070953 A1 | 3/2012 | Yu et al. |
| 2014/0239404 A1 | 8/2014 | Huang et al. |
| 2014/0377926 A1 | 12/2014 | Kim et al. |
| 2015/0243739 A1 | 8/2015 | Chen et al. |
| 2016/0196970 A1 | 7/2016 | Takamure et al. |
| 2016/0233088 A1 | 8/2016 | Feng et al. |

FOREIGN PATENT DOCUMENTS

| | | |
|---|---|---|
| JP | 2008053725 A | 3/2008 |
| KR | 20130049752 A | 5/2013 |

SEMICONDUCTOR STRUCTURE AND METHODS OF FORMING SAME

PRIORITY CLAIM AND CROSS-REFERENCE

This application is a continuation of U.S. patent application Ser. No. 15/985,495, filed on May 21, 2018 and entitled "Semiconductor Structure," which is a divisional of U.S. patent application Ser. No. 14/853,839, filed on Sep. 14, 2015 (now U.S. Pat. No. 9,978,866 issued on May 22, 2018) and entitled "Semiconductor Structure and Manufacturing Method Thereof," which application claims priority to U.S. Provisional Application No. 62/151,286, filed Apr. 22, 2015, which applications are herein incorporated by reference.

BACKGROUND

The present disclosure relates generally to semiconductor devices, and more specifically to fin field effect transistors (FinFETs).

Double-gate metal-oxide-semiconductor field-effect transistors (Double-gate MOSFETs) are MOSFETs that incorporate two gates into a single device. These devices are also known as fin field effect transistors (FinFETs) due to their structure including a thin "fin" extending from a substrate. The double gate is in that there is a gate on both sides of the channel allowing gate control of the channel from both sides. Furthermore, FinFETs can reduce the short channel effect and provide higher current flow. Other FinFET architectures may include three or more effective gates as well.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
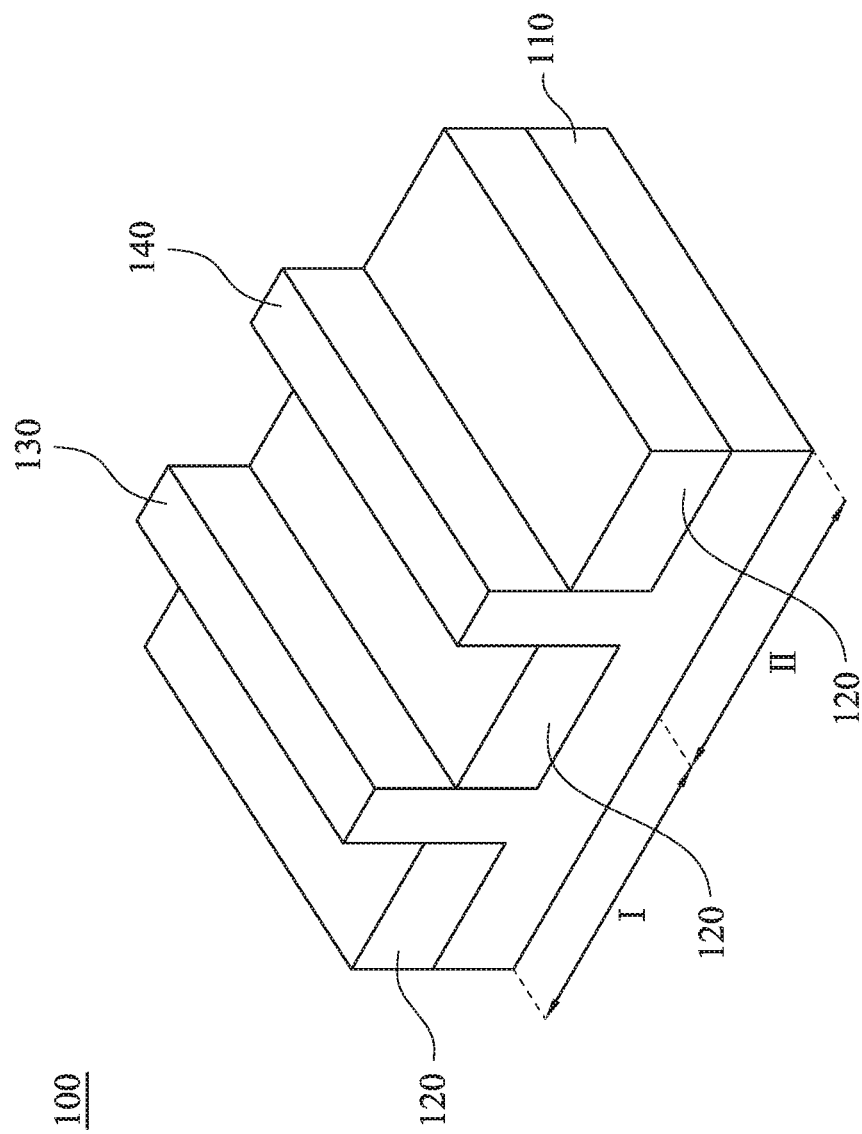
FIGS. 1 through 17 are cross-sectional views of intermediate stages in the manufacturing of fin field effect transistors (FinFETs) in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Reference is made to FIG. 1. An integrated circuit structure is formed. The illustrated integrated circuit structure includes a part of a wafer 100, which includes a substrate 110. The substrate 110 may be made of a semiconductor material, such as diamond, silicon (Si), germanium (Ge), silicon carbide (SiC), silicon-germanium (SiGe), or combinations thereof. The substrate 110 may be doped with a p-type or an n-type impurity. Isolation regions, such as shallow trench isolation (STI) regions 120, may be formed in or over the substrate 110. Semiconductor fins 130 and 140 are formed above the top surfaces of the STI regions 120. The substrate 110 includes a portion in a first device region I and a portion in a second device region II. The semiconductor fin 130 is in the first device region I, and the semiconductor fin 140 is in the second device region II. In some embodiments, the first device region I is used to form an N-type fin field-effect transistor (FinFET), and the second device region II is used to form a P-type FinFET.

In some embodiments, the semiconductor fins 130 and 140 are formed by forming the shallow trench isolation (STI) regions 120 first and then recessing the top surfaces of the STI regions 120 to a level lower than the original top surface of the substrate 110. The remaining portions of the substrate 110 between the STI regions 120 thus become the semiconductor fins 130 and 140. In the embodiments that the semiconductor fins 130 and 140 are made of a material different from that of the substrate 110, the semiconductor fins 130 and 140 can be formed by recessing top portions of the substrate 110 between neighboring STI regions 120 to form recesses and re-growing a semiconductor material different from that of the substrate 110 in the recesses. Top portions of the STI regions 120 may then be removed, while bottom portions of the STI regions 120 are not removed, so that top portions of the re-grown semiconductor material between neighboring STI regions 120 become the semiconductor fins 130 and 140. The semiconductor fins 130 and 140 may have channel dopings either introduced through implantations or through in-situ doping performed simultaneously with the growth of the semiconductor fins 130 and 140.

Figure 2:
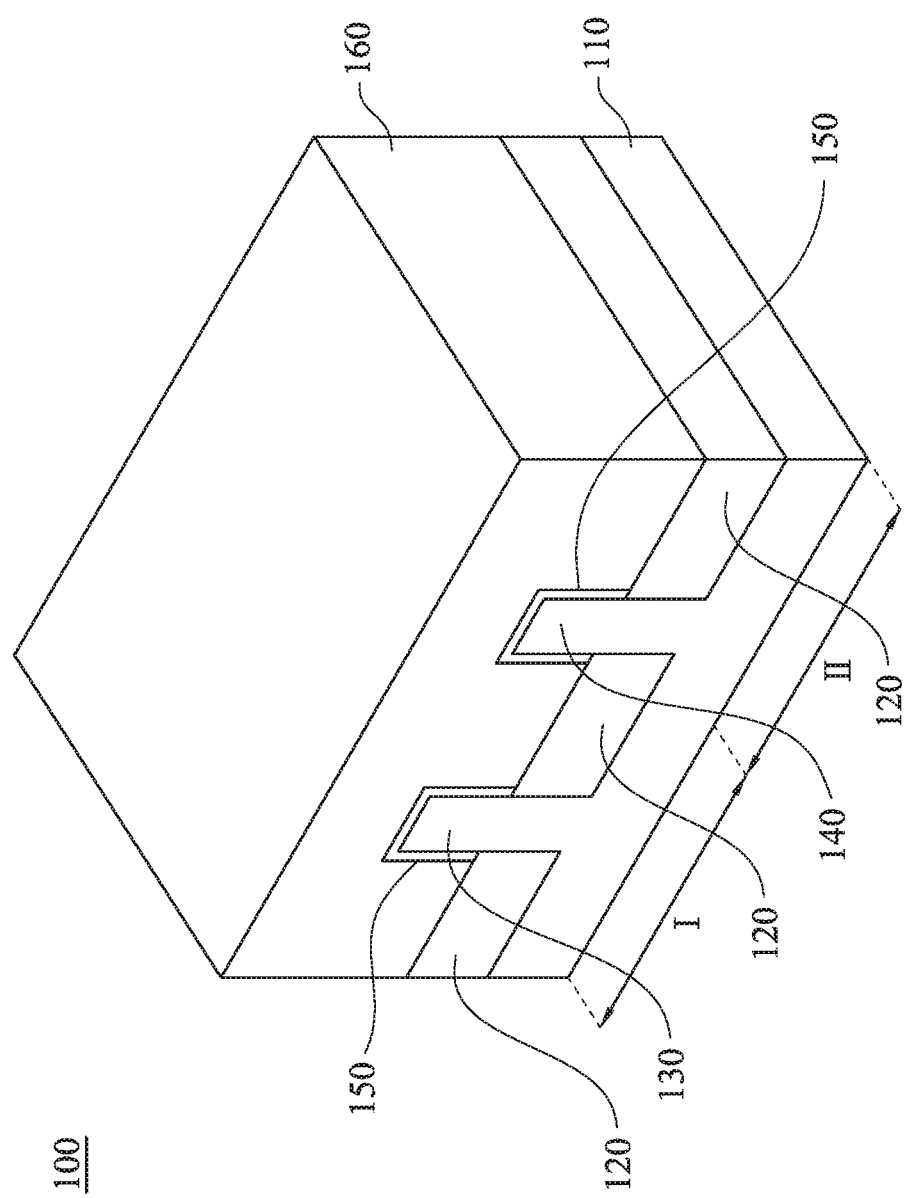

Reference is made to FIG. 2. A gate dielectric layer 150 and a gate electrode layer 160 are formed over the semiconductor fins 130 and 140. In some embodiments, the gate dielectric layer 150 is made of, for example, silicon oxide ($SiO_2$) and is formed by in-situ steam generated (ISSG) oxidation. The gate dielectric layer 150 has a thickness in a range from about 0.5 nm to about 10 nm. In some other embodiments, the gate dielectric layer 150 is made of, for example, a high-k dielectric material. The high-k dielectric material has a dielectric constant greater than that of silicon oxide ($SiO_2$), specifically about 4, or even greater than about 7. The high-k dielectric material may include aluminum-containing dielectrics, such as $Al_2O_3$, HfAlO, HfAlON, AlZrO, Hf-containing materials, such as $HfO_2$, $HfSiO_x$, HfAlO$_x$, HfZrSiO$_x$, HfSiON, and/or other materials, such as LaAlO$_3$ and ZrO$_2$. The gate electrode layer 160 is formed on the gate dielectric layer 150. The gate electrode layer 160 may be made of a conductive material, such as doped polysilicon, metals, metal nitrides, or combinations thereof.

Figure 3:
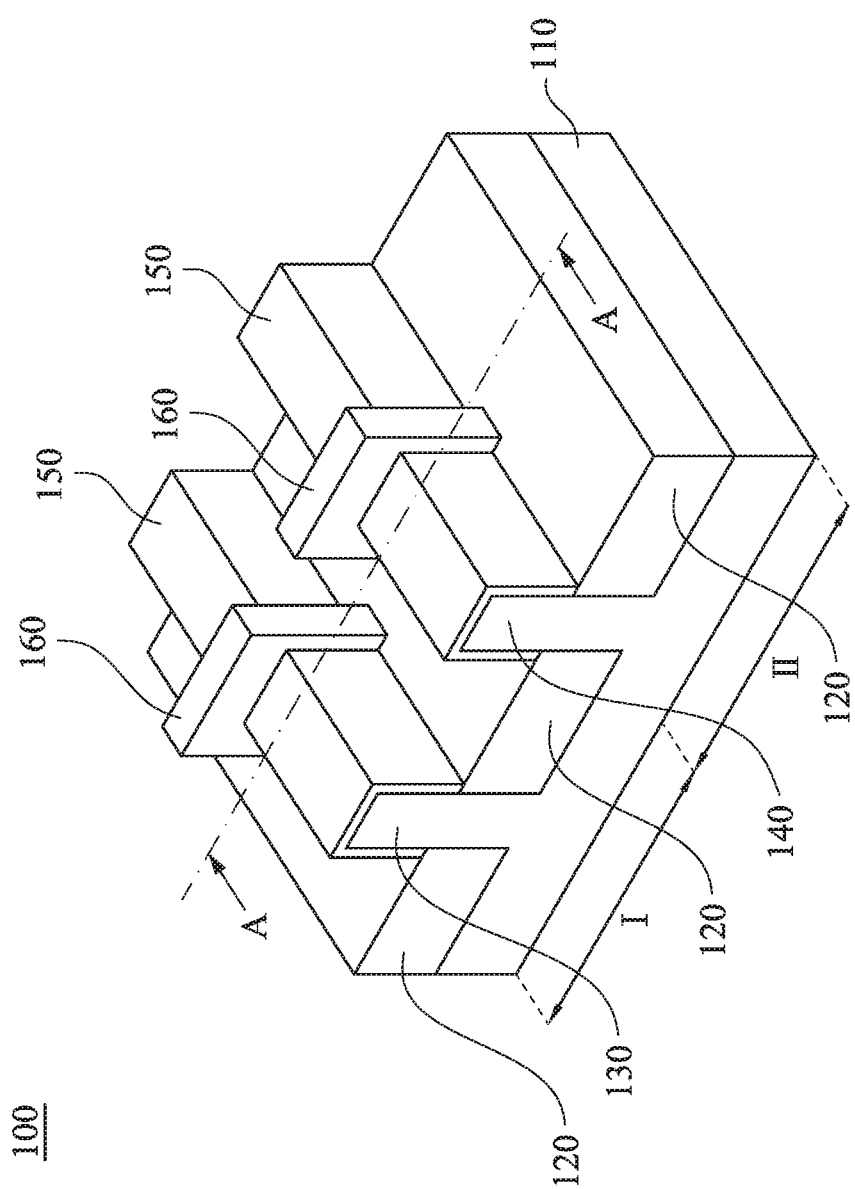

Reference is made to FIG. 3. The gate electrode layer 160 is then patterned to form gate stacks. In some embodiments, the semiconductor fins 130 and 140 may be capped with the gate dielectric layer 150. In some other embodiments, the gate dielectric layer 150 is also patterned, such that the semiconductor fins 130 and 140 have portions that are uncovered by the gate dielectric layer 150 and the gate electrode layer 160.

Figure 4:
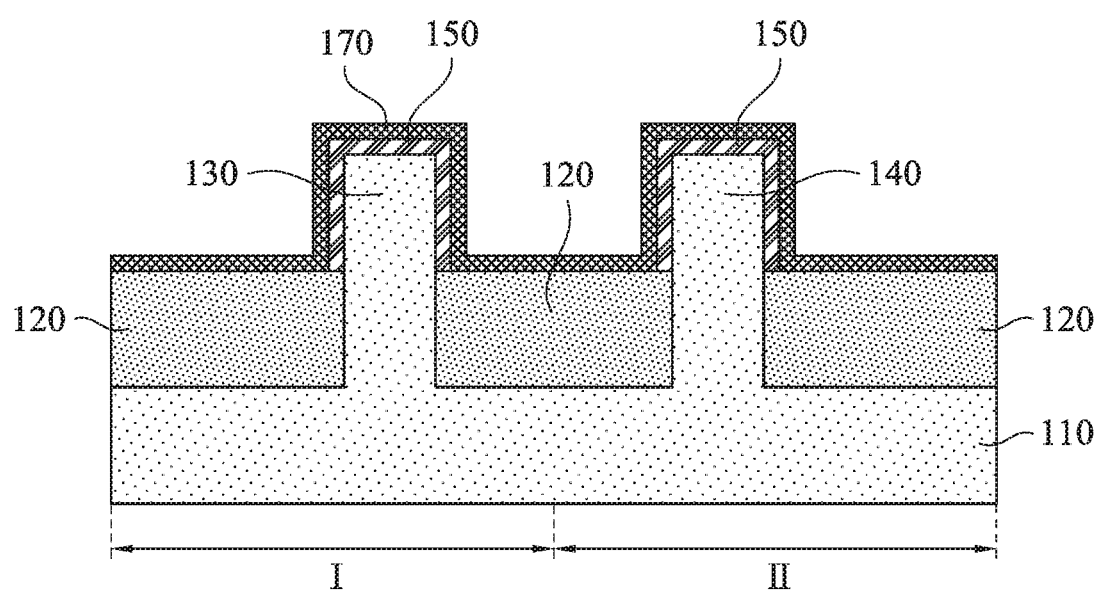

Reference is made to FIG. 4. A seal spacer 170 is formed over the semiconductor fins 130 and 140. The seal spacer 170 is made of a dielectric material, such as silicon nitride (Si$_3$N$_4$), silicon carbon oxynitride (SiCON), silicon carbon nitride (SiCN), or combinations thereof. The seal spacer 170 has a thickness in a range from about 1 nm to about 10 nm, form about 1 nm to about 7 nm, or form about 5 nm to about 10 nm. FIGS. 4-17 are cross-sectional views taken along a line A-A of FIG. 3. Accordingly, the patterned gate electrode layer 160 is not shown.

Figure 5:
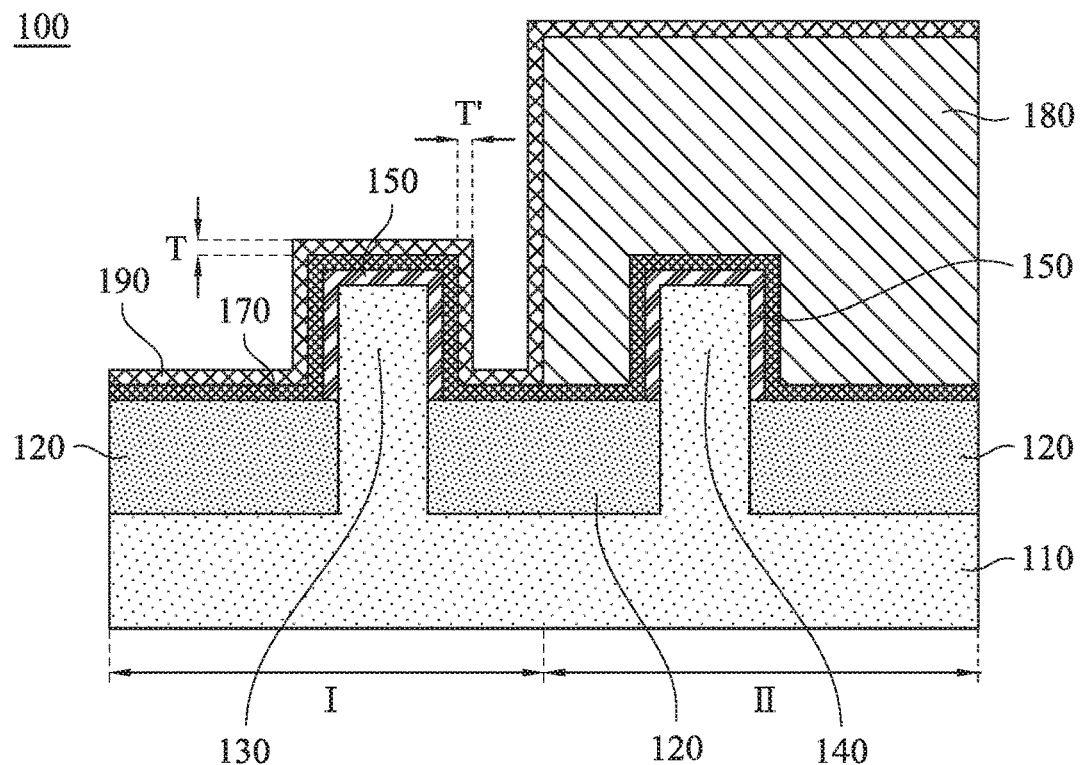

Reference is made to FIG. 5. A photoresist 180 is formed and patterned to cover the second device region II, while leaving the first device region I uncovered. Specifically, the photoresist 180 is applied onto the wafer 100 by, for example, spin coating. The photoresist 180 is then prebaked to drive off excess photoresist solvent. After prebaking, the photoresist 180 is exposed to a pattern of intense light. The exposure to light causes a chemical change that allows some of the photoresist 180 soluble in a photographic developer. A post-exposure bake (PEB) may be performed before developing to help reduce standing wave phenomena caused by the destructive and constructive interference patterns of the incident light. The photographic developer is then applied onto the photoresist 180 to remove the some of the photoresist 180 soluble in the photographic developer. The remaining photoresist 180 is then hard-baked to solidify the remaining photoresist 180.

Figure 18:
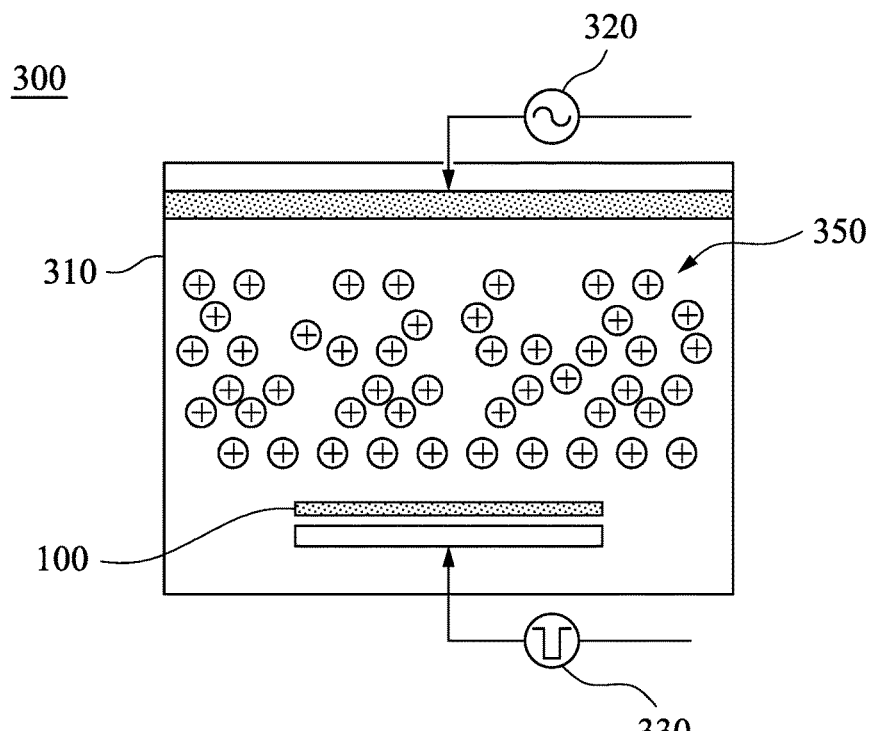
FIG. 18 illustrates an apparatus for performing plasma ion assisted deposition (PIAD).

After patterning the photoresist 180, a dopant-rich layer 190 is formed on the seal spacer 170. The dopant-rich layer 190 may be formed by, for example, plasma ion assisted deposition (PIAD). Specifically, the wafer 100 may be placed into an apparatus 300 as shown in FIG. 18, which is used for performing the PIAD. The apparatus 300 includes a chamber 310, in which the wafer 100 is placed, and power sources 320 and 330 connected into the chamber 310. The power source 320 may be a radio frequency (RF) power source with programmable pulse modulation function, while the power source 330 may be a direct current (DC) power source for providing a DC bias voltage.

The power sources 320 and 330 may be operated independently from each other. The power sources 320 and 330 may be programmed to be independently powered on and off without affecting each other. Using the apparatus 300 as illustrated in FIG. 18, the dopant-rich layer 190 is formed on the seal spacer 170 in the first device region I, as is shown in FIG. 5. The dopant-rich layer 190 has at least one impurity that is used for forming lightly-doped drain (LLD) regions in the semiconductor fin 130. Depending on the conductivity type of the resulting fin field effect transistor (FinFET), the dopant-rich layer 190 may have an n-type impurity (impurities) or a p-type impurity (impurities). For example, if the resulting FinFET is an n-type FinFET, the impurity in the dopant-rich layer 190 may be phosphorous, arsenic, or combinations thereof, while if the resulting FinFET is a p-type FinFET, the impurity in the dopant-rich layer 190 may be boron, indium, or combinations thereof. In some embodiments, the first device region I is used to form an N-type FinFET, and thus the impurity in the dopant-rich layer 190 is phosphorous, arsenic, or combinations thereof. The atomic percentage of the impurity in the dopant-rich layer 190 may be greater than about 80 percent, 90 percent, 95 percent, or even 99 percent, and may actually be a pure impurity layer.

Figure 19:
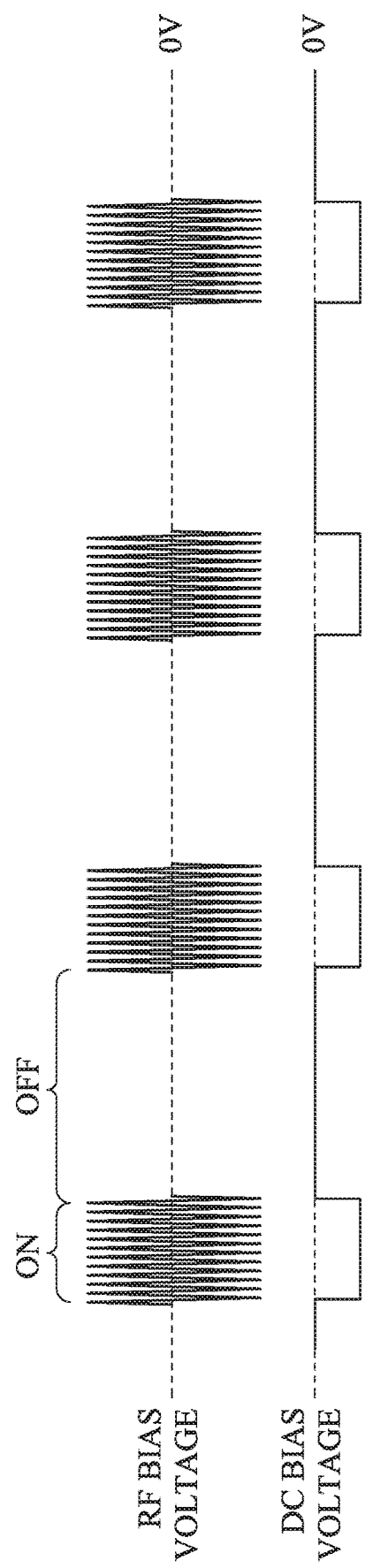
FIG. 19 shows schematic radio frequency (RF) and direct current (DC) bias voltages applied during the plasma ion assisted deposition (PIAD).

The process gases in the chamber 310 (shown in FIG. 18) may include AsH$_3$, B$_2$H$_6$, PH$_3$, BF$_3$, dilution gas, such as Xe, Ar, He, Ne, Kr, and/or the like, depending on the composition of the dopant-rich layer 190. The radio frequency (RF) power source 320 (shown in FIG. 18) is turned on to generate plasma 350. The power of the RF power source 320 may be in a range from about 50 watts to about 1,000 watts, for example, although a greater or a smaller power may also be used. In some embodiments, the RF power source 320 is turned on continuously during the entire period for forming the dopant-rich layer 190. In some other embodiments, the RF power source 320 is pulsed (in an on and off pattern) in order to improve the conformity (the step coverage) of the dopant-rich layer 190, as is schematically illustrated in FIG. 19, wherein the conformity of the dopant-rich layer 190 may be represented using ratio T'/T as shown in FIG. 5, with thickness T' being the thickness of the sidewall portions of the dopant-rich layer 190, with thickness T being the thickness of the top portion of the dopant-rich layer 190. In some embodiments, the conformity (ratio T'/T) may be greater than about 50 percent.

During the formation of the dopant-rich layer 190, the direct current (DC) power source 330 as shown in FIG. 18 is either turned off, or has a low bias voltage lower than about 1.5 kV so that there is no unwanted amorphization layer formation during the dopant-rich layer formation. In some embodiments, the bias voltage output of the DC power source 330 is in a range from about 0 kV to about 1.5 kV. With the low or even zero DC bias voltage, the directionality of the formation process is reduced, and hence the dopant-rich layer 190 may be deposited over the seal spacer 170 as a separate layer. The DC bias voltage provided by the DC power source 330 during the formation of the dopant-rich layer 190 may also be pulsed (turned on and off), as is schematically illustrated in FIG. 19.

Figure 6:
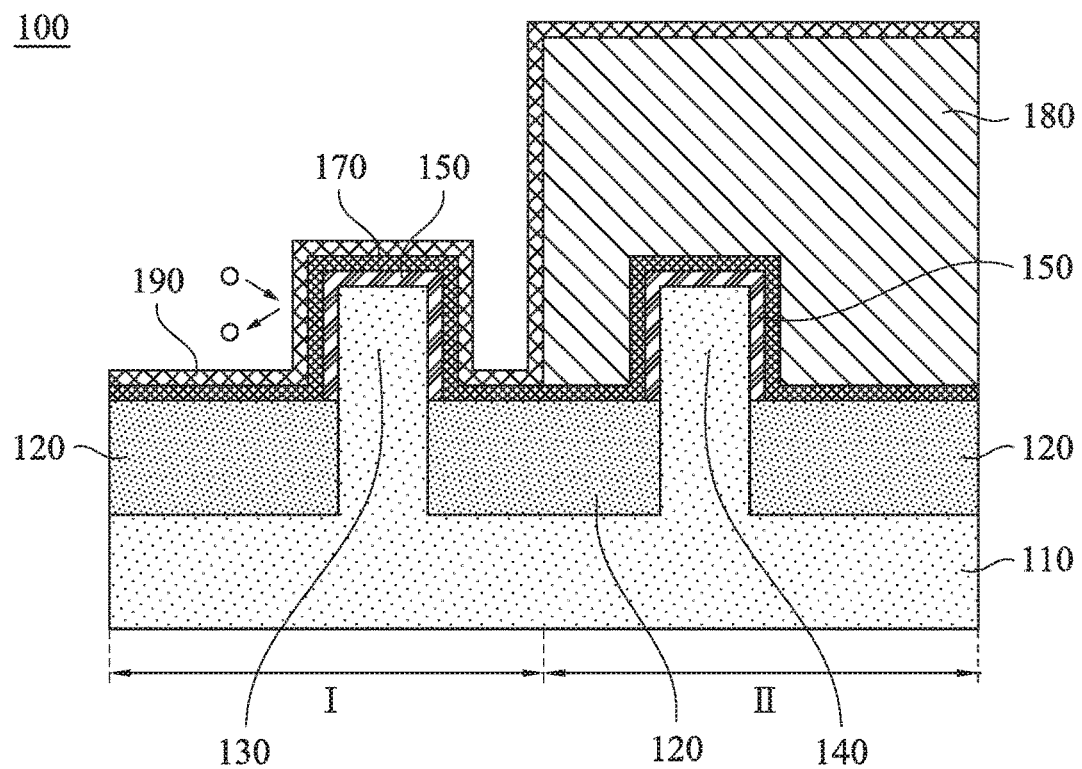

Reference is made to FIG. 6. A knock-on implantation is performed to knock the impurity in the dopant-rich layer 190 into the seal spacer 170, the gate dielectric layer 150, and/or the semiconductor fin 130. The ions used in the knock-on implantation may includes inert gas ions, such as Xe, Ar, Ne, He, Kr, or combinations thereof, or other ions that do not adversely affect the characteristics of the resulting fin field effect transistor (FinFET). In some embodiments, the knock-on implantation is induced by the scattering of the inert gas ions. Furthermore, the knock-on implantation and the plasma ion assisted deposition (PIAD) may be performed by the apparatus 300 as shown in FIG. 18. In some embodiments, the PIAD and the knock-on implantation can be considered a plasma doping (PLAD) process in deposition and ion modes.

Figure 7:
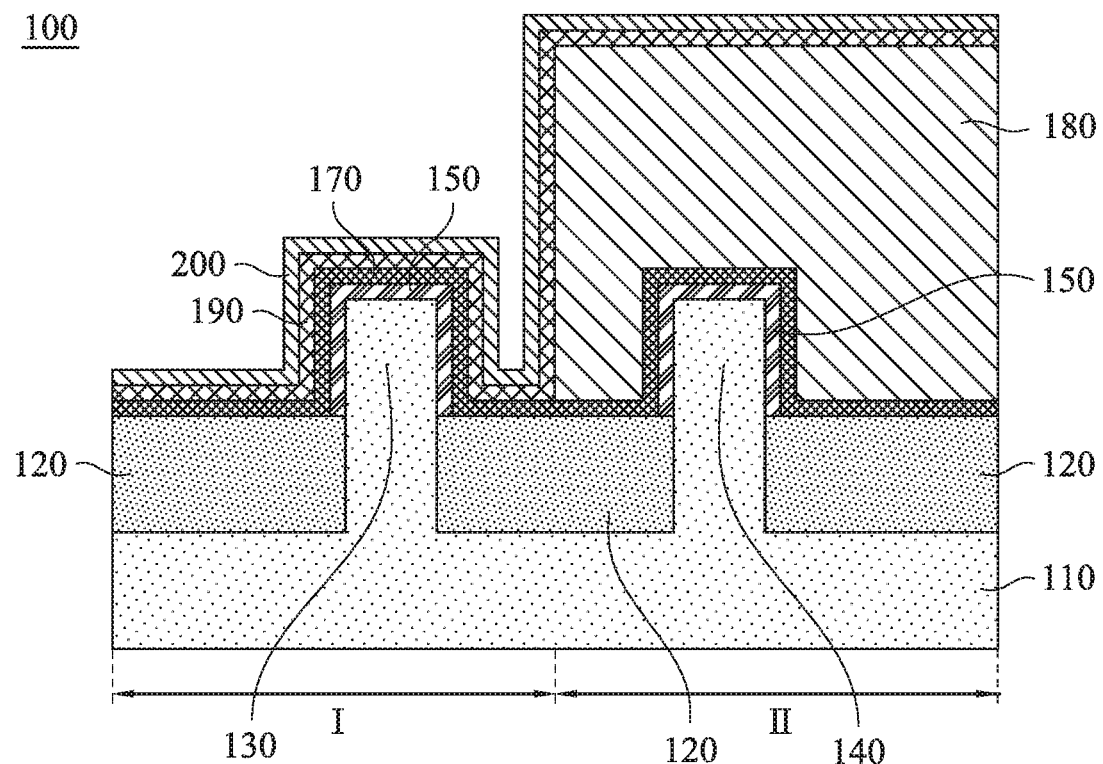

Reference is made to FIG. 7. After the knock-on implantation, as shown in FIG. 6, a cap layer 200 may be formed on the dopant-rich layer 190. The cap layer 200 can prevent the impurity from out-diffusion from the dopant-rich layer 190 during the following annealing process. The cap layer 200 is made of a dielectric material, such as silicon nitride (Si$_3$N$_4$), silicon carbon oxynitride (SiCON), silicon carbon nitride (SiCN), or combinations thereof. In some embodiments, the cap layer 200 may be an offset or dummy spacer dielectric. The cap layer 200 has a thickness in a range from about 0.5 nm to about 10 nm. The cap layer 200 is formed by, for example, chemical vapor deposition (CVD).

Figure 8:
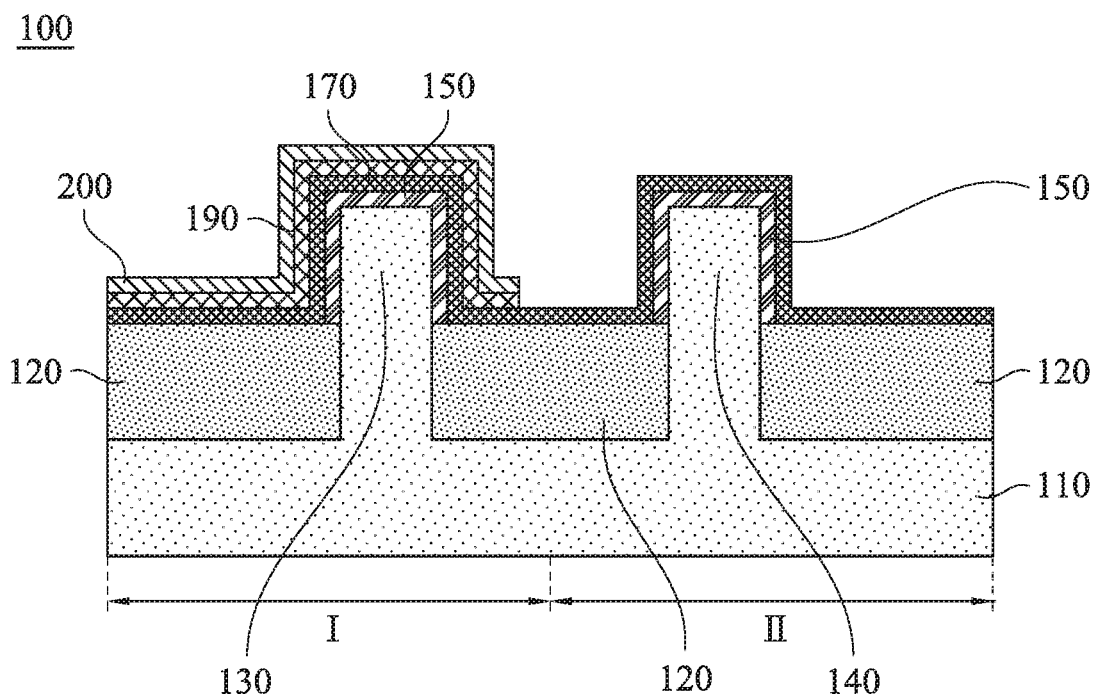

Reference is made to FIG. 8. Before annealing the wafer 100, the photoresist 180 is removed from the wafer 100 by, for example, plasma ashing or stripping. Plasma ashing uses a plasma source to generate a monatomic reactive species, such as oxygen or fluorine. The reactive species combines with the photoresist 180 to form ash which is removed with a vacuum pump. Stripping uses a photoresist stripper, such as acetone or a phenol solvent, to remove the photoresist 180 from the wafer 100.

Figure 9:
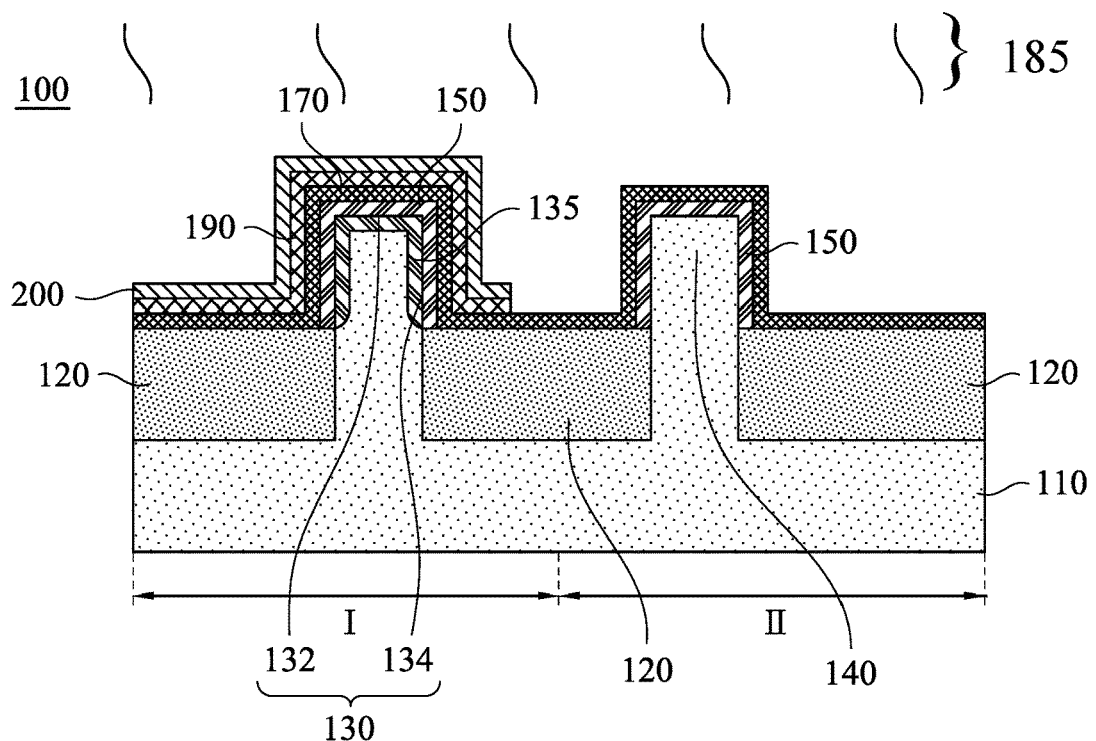

Reference is made to FIG. 9. The impurities in the dopant-rich layer 190, the seal spacer 170, and/or the gate dielectric layer 150 diffuse into the semiconductor fin 130 by a solid-phase diffusion (SPD) drive-in annealing process to form lightly-doped drain (LDD) regions 135. The SPD drive-in annealing process (schematically illustrated and generally notated by reference numeral 185) may be performed after the removal of the photoresist 180, so that the annealing process may be performed for a long duration (for example, in a range from about 1 second to about 10 seconds), and at a high temperature, for example, in a range from about 950 degrees Celsius to 1050 degrees Celsius. The annealing process may be, for example, spike annealing. Alternatively, the photoresist 180 (shown in FIGS. 5-7) may be replaced by a hard mask that may endure the high temperature of the annealing process. In some embodiments, the hard mask may be made of silicon nitride, silicon oxynitride, or combinations thereof. Accordingly, the annealing process may be performed before the removal of the hard mask. The remaining process of these embodiments may be essentially the same as illustrated in FIGS. 5-7 and hence is not repeated herein.

In the embodiments, by performing the dopant-rich layer 190 and then driving the impurities into the semiconductor fin 130, the impurities may reach desirable depths in a top surface 132 and sidewalls 134 of the semiconductor fin 130 without the concern of the shadowing effect and/or the plasma sheath effect even when the semiconductor fins 130 and 140 are separated from each other at a nanoscale distance. Therefore, the lightly-doped drain (LDD) regions 135 can be formed in the top surface 132 and the sidewalls 134 of the semiconductor fin 130.

In the structural point of view, the lightly-doped drain (LDD) regions 135 and the seal spacer 170 overlaying the LDD regions 135 may be doped with substantially the same type impurities, and/or the LDD regions 135 and the gate dielectric layer 150 overlaying the LDD regions 135 may be doped with substantially the same type impurities as well. Since the impurities are driven into the LDD regions 135 through the seal spacer 170 and/or the gate dielectric layer 150 overlaying the LDD regions 135, the impurities remaining in the seal spacer 170 and/or the gate dielectric layer 150 overlaying the LDD regions 135 and the impurities driven into the LDD regions 135 may be of substantially the same type.

Figure 10:
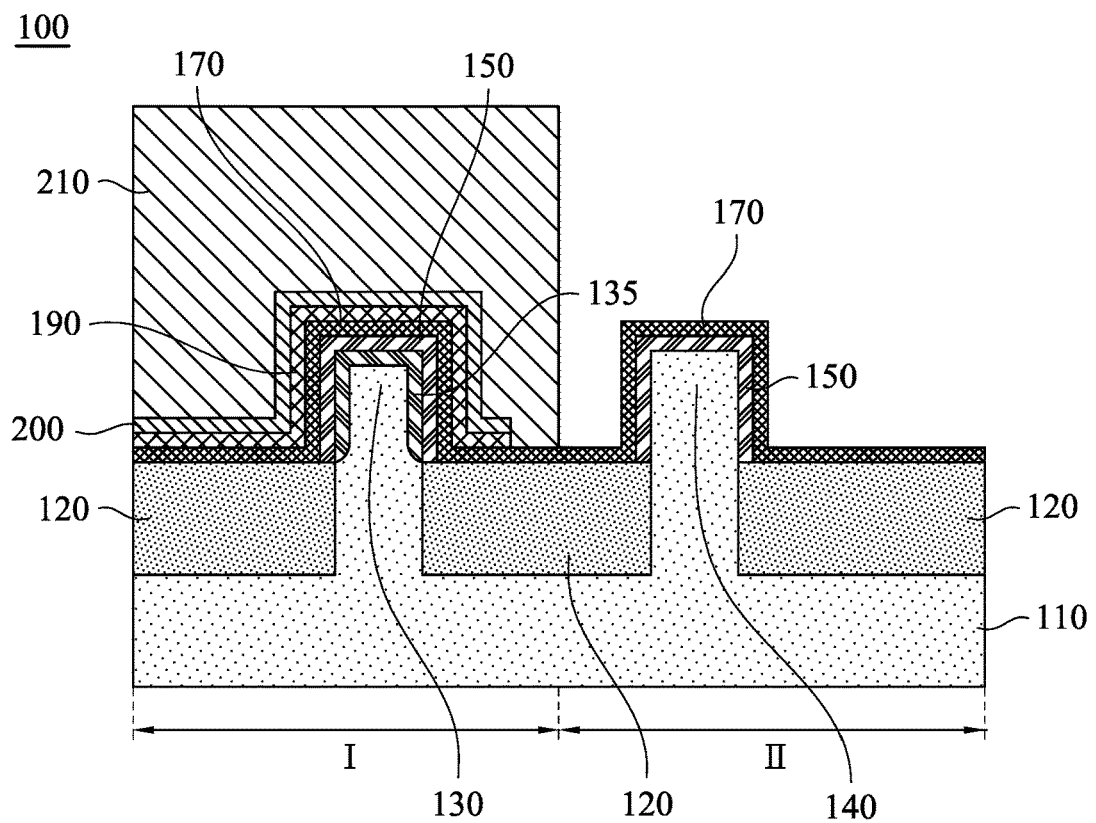

Reference is made to FIG. 10. A photoresist 210 is formed and patterned to cover the first device region I, while leaving the second device region II uncovered. Specifically, the photoresist 210 is applied onto the wafer 100 by, for example, spin coating. The photoresist 210 is then prebaked to drive off excess photoresist solvent. After prebaking, the photoresist 210 is exposed to a pattern of intense light. The exposure to light causes a chemical change that allows some of the photoresist 210 soluble in a photographic developer.

A post-exposure bake (PEB) may be performed before developing to help reduce standing wave phenomena caused by the destructive and constructive interference patterns of the incident light. The photographic developer is then applied onto the photoresist 210 to remove the some of the photoresist 210 soluble in the photographic developer. The remaining photoresist 210 is then hard-baked to solidify the remaining photoresist 210.

Figure 11:
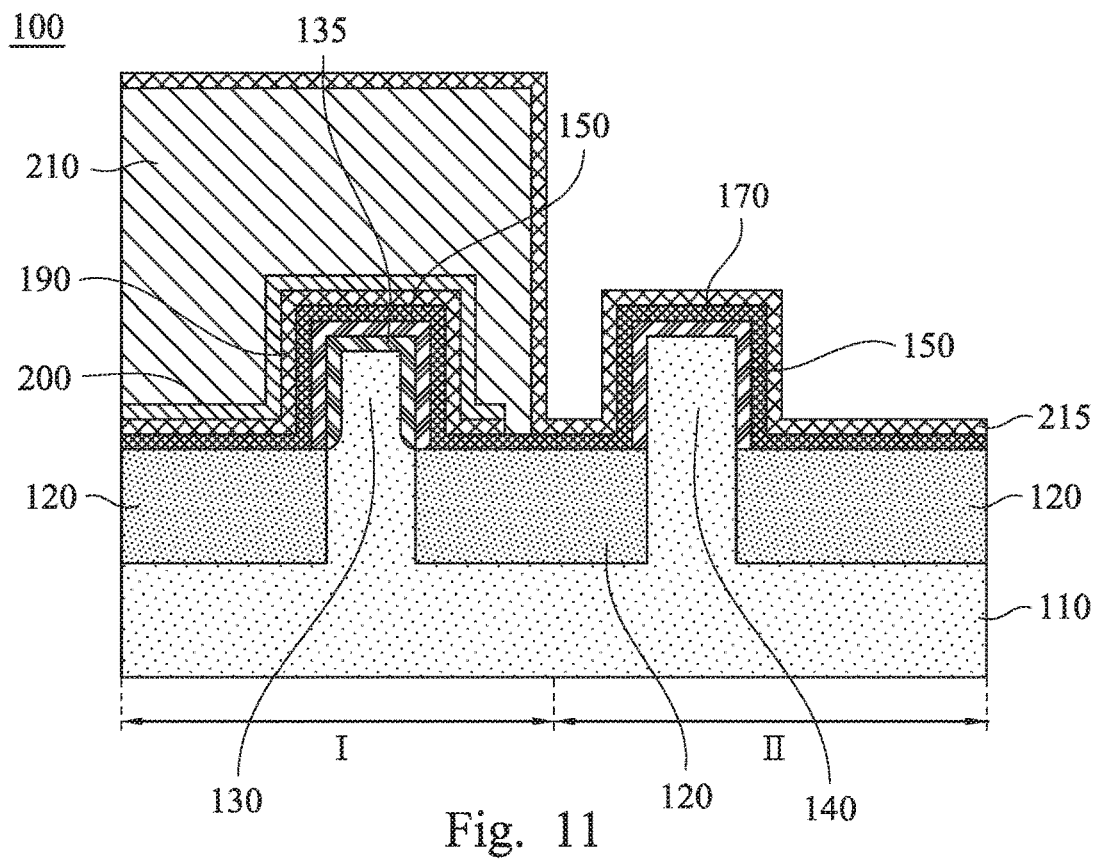
Figure 12:
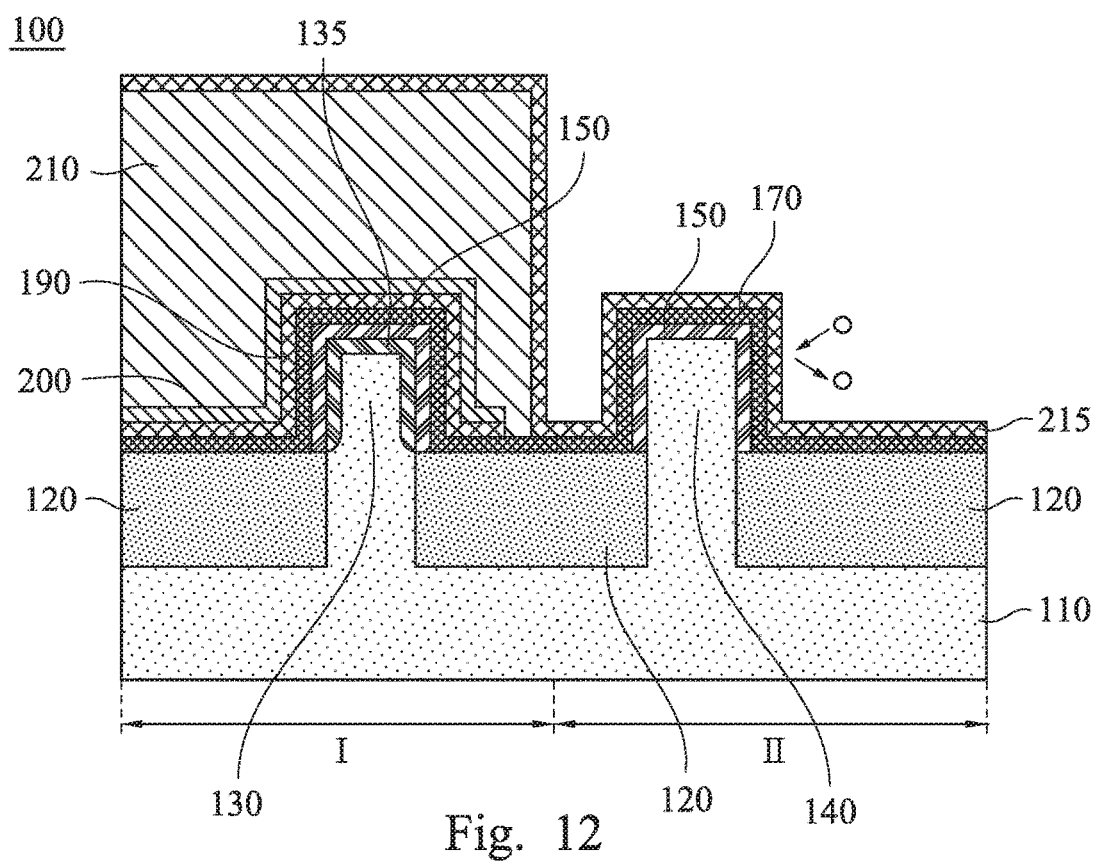

Reference is made to FIGS. 11 and 12. A diffusion enhancement dopant may be doped into the seal spacer 170 and/or the gate dielectric layer 150 in the second device region II. The diffusion enhancement dopant is able to enhance the diffusion of an impurity which will diffuse into the semiconductor fin 140 in the following steps in the seal spacer 170 and/or the gate dielectric layer 150. In some embodiments, the second device region II is used to form a P-type fin field effect transistor (FinFET), and therefore the impurity which will diffuse into the semiconductor fin 140 in the following steps may be boron. However, the seal spacer 170 and/or the gate dielectric layer 150 made of a nitride material, an oxide material, or combinations thereof tend to retard the diffusion of boron in the seal spacer 170 and/or the gate dielectric layer 150. Therefore, the diffusion enhancement dopant may be doped into the seal spacer 170 and/or the gate dielectric layer 150 to enhance the diffusion of the impurity in the seal spacer 170 and/or the gate dielectric layer 150. In some embodiments, the diffusion enhancement dopant is, for example, fluorine.

In some embodiments, the doping of the diffusion enhancement dopant may use essentially the same process (including plasma ion assisted deposition (PIAD) and knock-on implantation processes) as discussed, except the diffusion enhancement dopant may be, for example, fluorine. Specifically, a diffusion enhancement dopant-rich layer 215 is formed on the seal spacer 170 by PIAD, as is shown in FIG. 11. A knock-on implantation is performed to knock the diffusion enhancement dopant in the diffusion enhancement dopant-rich layer 215 into the seal spacer 170 and/or the gate dielectric layer 150, as is shown in FIG. 12. The ions used in the knock-on implantation may includes inert gas ions, such as Xe, Ar, Ne, He, Kr, or combinations thereof, or other ions that do not adversely affect the characteristics of the resulting fin field effect transistor (FinFET). In some embodiments, the knock-on implantation is induced by the scattering of the inert gas ions.

Figure 13:
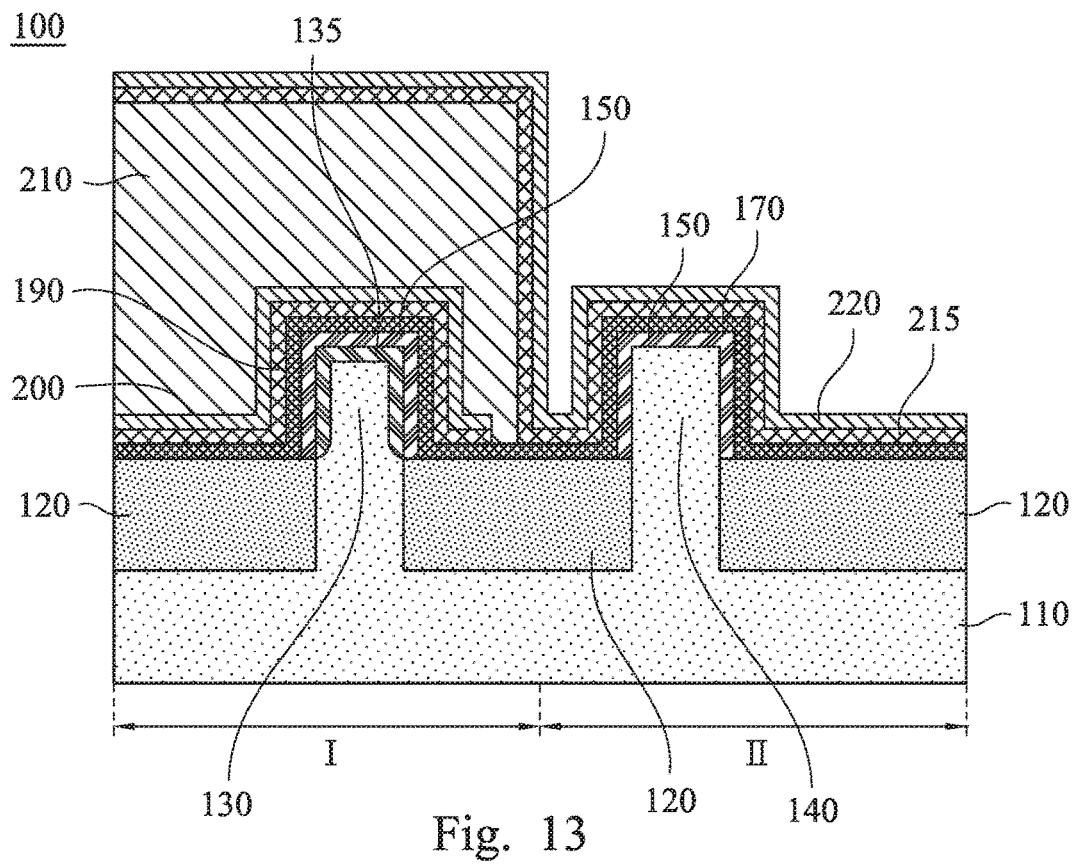

Reference is made to FIG. 13. A dopant-rich layer 220 is formed on the diffusion enhancement dopant-rich layer 215. The dopant-rich layer 220 may be formed by plasma ion assisted deposition (PIAD). The formation of the dopant-rich layer 220 may use essentially the same process as the formation of the dopant-rich layer 170, except the dopant-rich layer 220 may have a different type impurity than that of the dopant-rich layer 170, and hence is not repeated herein.

Figure 14:
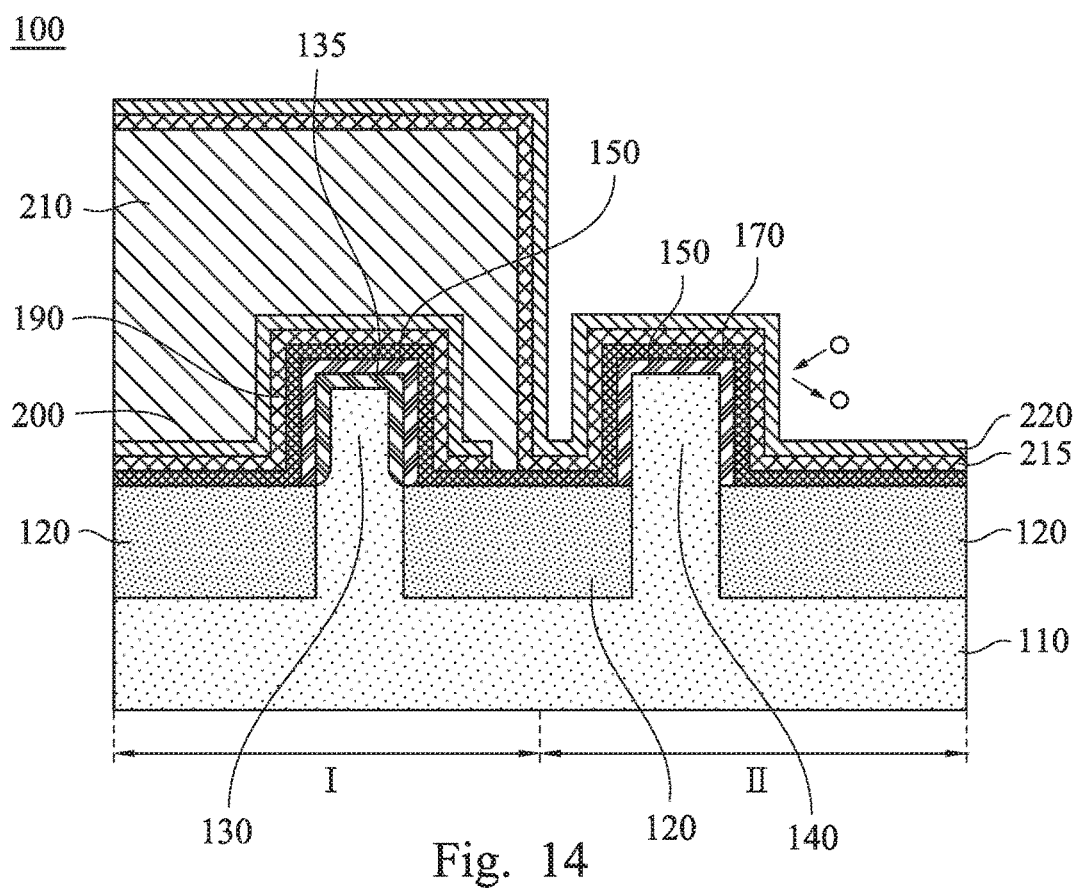

Reference is made to FIG. 14. A knock-on implantation is performed to knock the impurity in the dopant-rich layer 220 into the diffusion enhancement dopant-rich layer 215, the seal spacer 170, the gate dielectric layer 150, and/or the semiconductor fin 140. The ions used in the knock-on implantation may includes inert gas ions, such as Xe, Ar, Ne, He, Kr, or combinations thereof, or other ions that do not adversely affect the characteristics of the resulting fin field effect transistor (FinFET). In some embodiments, the knock-on implantation is induced by the scattering of the inert gas ions. The knock-on implantation shown in FIG. 14 may be essentially the same as the knock-on implantation shown in FIG. 6, except the dopant-rich layer 220 may have a different type impurity than that of the dopant-rich layer 170, and hence is not repeated herein.

Figure 15:
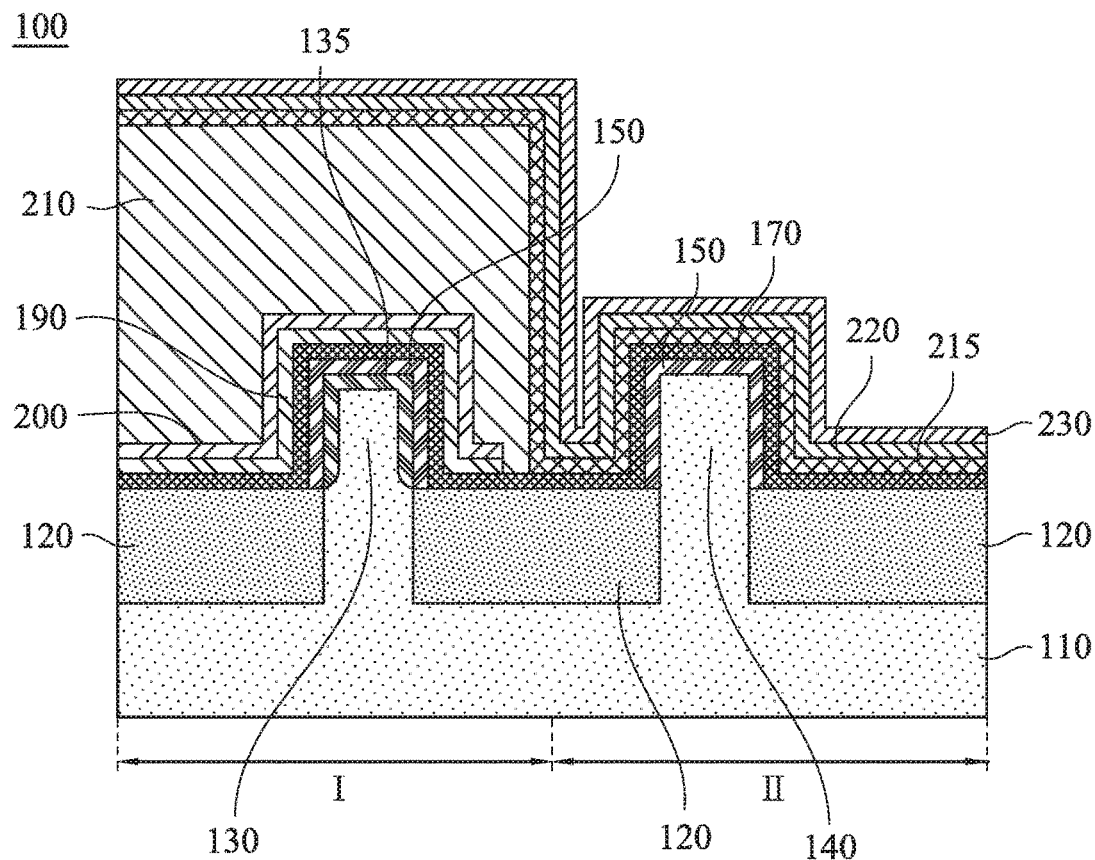

Reference is made to FIG. 15. After the knock-on implantation, as shown in FIG. 14, a cap layer 230 may be formed on the dopant-rich layer 220. The cap layer 230 can prevent the impurity from out-diffusion from the dopant-rich layer 220 during the following annealing process. The cap layer 230 is made of a dielectric material, such as silicon nitride ($Si_3N_4$), silicon carbon oxynitride (SiCON), silicon carbon nitride (SiCN), or combinations thereof. In some embodiments, the cap layer 230 may be an offset or dummy spacer dielectric. The cap layer 230 has a thickness in a range from about 0.5 nm to about 10 nm. The cap layer 230 is formed by, for example, chemical vapor deposition (CVD).

Figure 16:
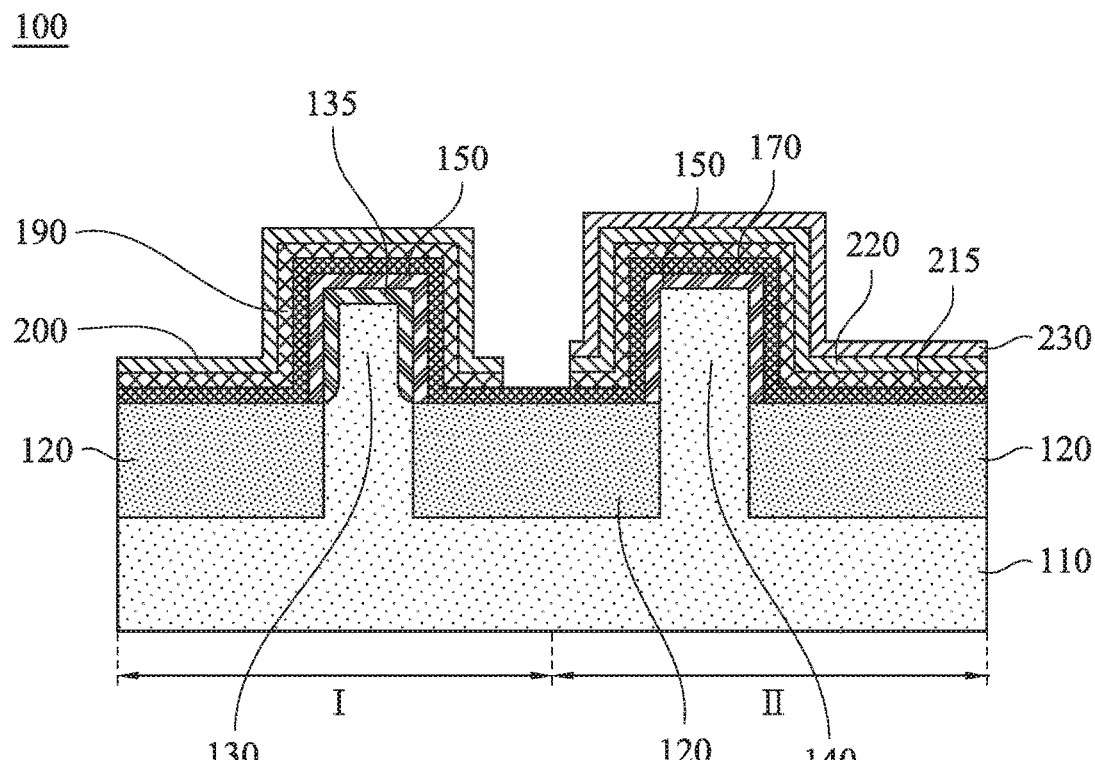

Reference is made to FIG. 16. Before annealing the wafer 100, the photoresist 210 is removed from the wafer 100 by, for example, plasma ashing or stripping. Plasma ashing uses a plasma source to generate a monatomic reactive species, such as oxygen or fluorine. The reactive species combines with the photoresist 210 to form ash which is removed with a vacuum pump. Stripping uses a photoresist stripper, such as acetone or a phenol solvent, to remove the photoresist 210 from the wafer 100.

Figure 17:
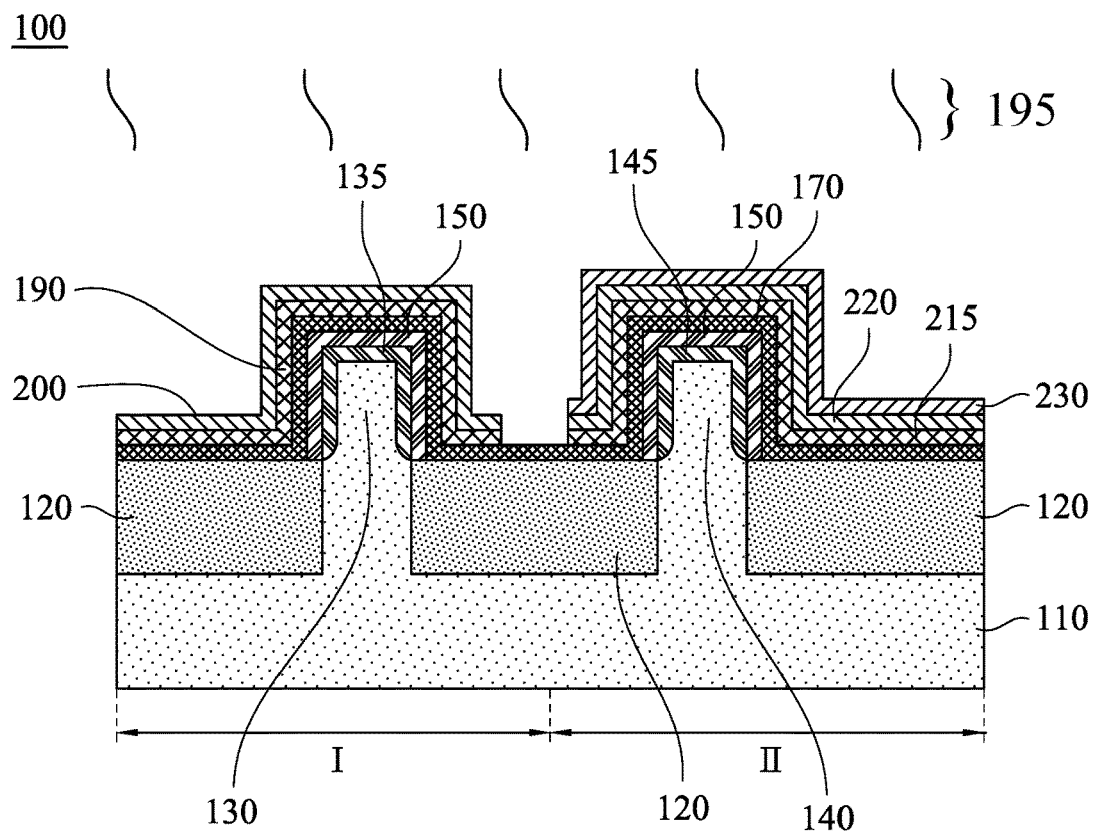

Reference is made to FIG. 17. The impurities in the dopant-rich layer 220, the diffusion enhancement dopant-rich layer 215, the seal spacer 170, and/or the gate dielectric layer 150 diffuse into the semiconductor fin 140 by a solid-phase diffusion (SPD) drive-in annealing process to form lightly-doped drain (LDD) regions 145. The SPD drive-in annealing process (schematically illustrated and generally notated by reference numeral 195) may be performed after the removal of the photoresist 210, so that the annealing process may be performed for a long duration (for example, in a range from about 1 second to about 10 seconds), and at a high temperature, for example, in a range from about 950 degrees Celsius to 1050 degrees Celsius. The annealing process may be, for example, spike or soak annealing. In some embodiments, the annealing process shown in FIG. 17 may have a greater thermal budget than that of the annealing process shown in FIG. 9. Alternatively, the photoresist 210 (shown in FIGS. 10-15) may be replaced by a hard mask that may endure the high temperature of the annealing process. In some embodiments, the hard mask may be made of silicon nitride, silicon oxynitride, or combinations thereof. Accordingly, the annealing process may be performed before the removal of the hard mask. The remaining process of these embodiments may be essentially the same as illustrated in FIGS. 10-15 and hence is not repeated herein.

In some embodiments, when the impurities diffusing into the semiconductor fin 140 are boron, the annealing process may be performed in an $O_2$ ambient. The seal spacer 170 and/or the gate dielectric layer 150 made of a nitride material, an oxide material, or combinations thereof tend to retard the diffusion of boron in the seal spacer 170 and/or the gate dielectric layer 150. Therefore, the annealing process may be performed in an $O_2$ ambient to enhance the diffusion of boron in the seal spacer 170 and/or the gate dielectric layer 150.

In the embodiments, by performing the dopant-rich layer 220 and then driving the impurities into the semiconductor fin 140, the impurities may reach desirable depths in a top surface 142 and sidewalls 144 of the semiconductor fin 140 without the concern of the shadowing effect and/or the plasma sheath effect even when the semiconductor fins 130 and 140 are separated from each other at a nanoscale distance. Therefore, the lightly-doped drain (LDD) regions 145 can be formed in the top surface 142 and the sidewalls 144 of the semiconductor fin 140.

In the structural point of view, the lightly-doped drain (LDD) regions 145 and the seal spacer 170 overlaying the LDD regions 145 may be doped with substantially the same type impurities, and/or the LDD regions 145 and the gate dielectric layer 150 overlaying the LDD regions 145 may be doped with substantially the same type impurities as well. Since the impurities are driven into the LDD regions 145 through the seal spacer 170 and/or the gate dielectric layer 150 overlaying the LDD regions 145, the impurities remaining in the seal spacer 170 and/or the gate dielectric layer 150 overlaying the LDD regions 145 and the impurities driven into the LDD regions 145 may be of substantially the same type.

It is understood that for the embodiments shown above, additional processes may be performed to complete the fabrication of a semiconductor device. For example, these additional processes may include a source/drain epitaxy loop, formation of contacts, formation of interconnect structures (e.g., lines and vias, metal layers, and interlayer dielectric that provide electrical interconnection to the semiconductor device), formation of passivation layers, and packaging of the semiconductor device.

In order to form the lightly-doped drain (LDD) regions in the top surface and the sidewalls of the semiconductor fin without the concern of the shadowing effect and/or the plasma sheath effect, in the embodiments, an indirect plasma doping (PLAD) process is performed. That is, a dopant-rich layer is formed, and then the impurities in the dopant-rich layer are driven into the semiconductor fin. By performing the PLAD process, the impurities may reach desirable depths in the top surface and the sidewalls of the semiconductor fin without the concern of the shadowing effect and/or the plasma sheath effect.

According to some embodiments, a semiconductor structure includes a substrate, a first semiconductor fin, a second semiconductor fin, and a first lightly-doped drain (LDD) region. The first semiconductor fin is disposed on the substrate. The first semiconductor fin has a top surface and sidewalls. The second semiconductor fin is disposed on the substrate. The first semiconductor fin and the second semiconductor fin are separated from each other at a nanoscale distance. The first lightly-doped drain (LDD) region is disposed at least in the top surface and the sidewalls of the first semiconductor fin.

According to some embodiments, a method for manufacturing a semiconductor structure is provided. The method includes forming at least one semiconductor fin on a substrate, in which the semiconductor fin has a top surface and sidewalls; forming at least one dielectric layer on the top surface and the sidewalls of the semiconductor fin; forming a dopant-rich layer comprising at least one impurity on the dielectric layer; and driving the impurity into the semiconductor fin through the dielectric layer.

According to some embodiments, a method for manufacturing a semiconductor structure is provided. The method includes forming at least one first semiconductor fin and at least one second semiconductor fin on a substrate, in which the first semiconductor fin has a top surface and sidewalls; forming at least one first dielectric layer on the top surface and the sidewalls of the first semiconductor fin; forming a first photoresist to cover the second semiconductor fin, with the first dielectric layer not covered; implanting at least one first impurity into the first dielectric layer; removing the first photoresist; and driving the first impurity into the first semiconductor fin.

One general aspect of embodiments disclosed herein includes a semiconductor structure, including: a substrate. The semiconductor structure also includes a first semiconductor fin disposed on the substrate, where the first semiconductor fin has a top surface and sidewalls. The semiconductor structure also includes a second semiconductor fin disposed on the substrate, where the first semiconductor fin and the second semiconductor fin are separated from each other at a nanoscale distance. The semiconductor structure also includes a first lightly-doped drain (LDD) region disposed at least in the top surface and the sidewalls of the first semiconductor fin; and a first seal spacer overlying at least the first lightly-doped drain (LDD) region.

Another general aspect of embodiments disclosed herein includes a semiconductor structure, comprising: a substrate; a first semiconductor fin disposed on the substrate, wherein the first semiconductor fin has a top surface and sidewalls; a first lightly-doped drain (LDD) region disposed at least in the top surface and the sidewalls of the first semiconductor fin; a seal spacer overlying at least the first lightly-doped drain (LDD) region; and a cap layer on the seal spacer.

Yet another general aspect of embodiments disclosed herein includes a first fin extending from a substrate and a second fin extending from the substrate and adjacent to the first fin; a first gate dielectric extending at least partially over a top surface and sidewalls of the first fin and at least partially over a top surface and sidewalls of the second fin; a seal spacer extending over the first gate dielectric and a second gate dielectric; first dopant-rich layer extending on the seal spacer and over the first gate dielectric and a second dopant-rich layer extending on the seal spacer and over the second gate dielectric; and a first cap layer on the first dopant-rich layer and a second cap layer on the second dopant-rich layer.

One general aspect includes a method for manufacturing a semiconductor structure, forming at least one semiconductor fin on a substrate, where the semiconductor fin has a top surface and sidewalls. The method also includes forming at least one dielectric layer on the top surface and the sidewalls of the semiconductor fin. The method also includes forming a dopant-rich layer may include dopants on the dielectric layer. The method also includes and forming a lightly-doped drain (LDD) region extending along the top surface and the sidewalls of the at least one semiconductor fin by driving the dopants into the semiconductor fin through the dielectric layer.

One general aspect includes a method of manufacturing a semiconductor structure, forming a first semiconductor fin and a second semiconductor fin over a substrate, where the first semiconductor fin has a top surface and sidewalls and where the first semiconductor fin and the second semiconductor fin are separated from each other. The method of manufacturing also includes forming a first lightly-doped drain (LDD) region disposed at least in the top surface and the sidewalls of the first semiconductor fin, the forming including depositing a first dopant-rich layer over the first semiconductor fin, and driving dopants from the first dopant-rich layer into the first semiconductor fin. The manufacturing also includes forming a second lightly-doped drain (LDD) region disposed at least in the top surface and the sidewalls of the second semiconductor fin, where the forming including: depositing a dielectric layer on the second semiconductor fin, depositing a diffusion enhancement dopant layer on the dielectric layer, driving diffusion enhancement dopants from the diffusion enhancement dopant layer on the dielectric layer, depositing a second dopant-rich layer over the second semiconductor fin, and driving dopants from the second dopant-rich layer into the second semiconductor fin.

One general aspect includes a semiconductor structure, a substrate. The semiconductor structure also includes a first semiconductor fin disposed on the substrate, where the first semiconductor fin has a top surface and sidewalls. The structure also includes a second semiconductor fin disposed on the substrate, where the first semiconductor fin and the second semiconductor fin are separated from each other. The structure also includes a first lightly-doped drain (LDD) region disposed at least in the top surface and the sidewalls of the first semiconductor fin, the LDD region including a first species of dopant. The structure also includes and a dopant source layer overlying the LDD region, the dopant source layer including said first species of dopant.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor structure, the method comprising:
   forming at least one semiconductor fin on a substrate, wherein the semiconductor fin has a top surface and sidewalls;
   forming at least one dielectric layer on the top surface and the sidewalls of the semiconductor fin;
   forming a dopant-rich layer comprising dopants on the dielectric layer; and
   forming a lightly-doped drain (LDD) region extending along the top surface and the sidewalls of the at least one semiconductor fin by driving the dopants into the semiconductor fin through the dielectric layer.

2. The method of claim 1, wherein the step of forming a lightly-doped drain includes the steps of:
   a knock-on implantation to drive the at least some of the dopants into the dielectric layer; and
   an anneal to drive at least some of the dopants into the at least one semiconductor fin.

3. The method of claim 2, wherein the knock-on implantation includes scattering of inert gas ions.

4. The method of claim 2, further comprising forming a hard mask over the dopant-rich layer prior to the anneal step.

5. The method of claim 1, wherein the step of forming at least one dielectric layer on the top surface and the sidewalls of the semiconductor fin includes depositing a gate dielectric layer, a dielectric seal spacer, or both.

6. The method of claim 1, wherein the step of forming a dopant-rich layer comprising dopants on the dielectric layer includes a plasma ion assisted deposition.

7. The method of claim 1, further comprising depositing the dopant-rich layer to have a conformity ratio of greater than about 50 percent.

8. A method of manufacturing a semiconductor structure, the method comprising:

forming a first semiconductor fin and a second semiconductor fin over a substrate, wherein the first semiconductor fin has a top surface and sidewalls and wherein the first semiconductor fin and the second semiconductor fin are separated from each other;

forming a first lightly-doped drain (LDD) region disposed at least in the top surface and the sidewalls of the first semiconductor fin, the forming including
depositing a first dopant-rich layer over the first semiconductor fin, and
driving dopants from the first dopant-rich layer into the first semiconductor fin;

forming a second lightly-doped drain (LDD) region disposed at least in the top surface and the sidewalls of the second semiconductor fin, wherein the forming including:
depositing a dielectric layer on the second semiconductor fin,
depositing a diffusion enhancement dopant layer on the dielectric layer,
driving diffusion enhancement dopants from the diffusion enhancement dopant layer on the dielectric layer,
depositing a second dopant-rich layer over the second semiconductor fin, and
driving dopants from the second dopant-rich layer into the second semiconductor fin.

9. The method of claim 8, wherein the first semiconductor fin and the second semiconductor fin are separated from each other at a nanoscale distance.

10. The method of claim 8, wherein the step of depositing a first dopant-rich layer over the first semiconductor fin includes a plasma ion assisted deposition process.

11. The method of claim 8, wherein the step of driving dopants from the first dopant-rich layer into the first semiconductor fin includes a knock-on implantation process.

12. The method of claim 8, wherein the step of driving dopants from the first dopant-rich layer into the first semiconductor fin includes an anneal process.

13. The method of claim 8, further comprising depositing a gate dielectric layer and a seal spacer layer on the first semiconductor fin.

14. The method of claim 8, further comprising depositing a cap layer over the first dopant-rich layer before the step of driving dopants from the first dopant-rich layer into the first semiconductor fin.

15. The method of claim 8, wherein the step of depositing a diffusion enhancement dopant layer on the dielectric layer includes depositing a fluorine containing layer.

16. The method of claim 15, further comprising driving fluorine from the fluorine containing layer into the dielectric layer.

17. The method of claim 16, wherein fluorine from the fluorine containing layer into the dielectric layer by a knock-on implantation process.

18. A semiconductor structure, comprising:
a substrate;
a first semiconductor fin disposed on the substrate, wherein the first semiconductor fin has a top surface and sidewalls;
a second semiconductor fin disposed on the substrate, wherein the first semiconductor fin and the second semiconductor fin are separated from each other;
a first lightly-doped drain (LDD) region disposed at least in the top surface and the sidewalls of the first semiconductor fin, the LDD region including a first species of dopant; and
a dopant source layer overlying the LDD region, the dopant source layer including said first species of dopant.

19. The semiconductor structure of claim 18, further comprising a seal spacer that extends over both the first semiconductor fin and the second semiconductor fin.

20. The semiconductor structure of claim 18, further comprising:
a second lightly-doped drain (LDD) region disposed at least in the top surface and the sidewalls of the second semiconductor fin, the second LDD region including a second species of dopant, different from the first species of dopant; and
a second dopant source layer overlying the second LDD region, the second dopant source layer including said second species of dopant.

* * * * *